United States Patent
Laude et al.

(10) Patent No.: US 7,750,076 B2
(45) Date of Patent: Jul. 6, 2010

(54) POLYMER COMPRISING SILICONE AND AT LEAST ONE METAL TRACE

(75) Inventors: Lucien D. Laude, Rabastens-de-Bigorre (FR); Neil Hamilton Talbot, Montrose, CA (US); Robert J. Greenberg, Los Angeles, CA (US)

(73) Assignee: Second Sight Medical Products, Inc., Sylmar, CA (US)

( * ) Notice: Subject to any disclaimer, the term of this patent is extended or adjusted under 35 U.S.C. 154(b) by 773 days.

(21) Appl. No.: 11/595,516

(22) Filed: Nov. 10, 2006

(65) Prior Publication Data

US 2007/0287784 A1    Dec. 13, 2007

Related U.S. Application Data

(60) Provisional application No. 60/811,683, filed on Jun. 7, 2006.

(51) Int. Cl.
*C08L 83/04*    (2006.01)
(52) U.S. Cl. .................. 524/588; 428/450; 524/430
(58) Field of Classification Search .......... 524/430, 524/588; 428/450
See application file for complete search history.

(56) References Cited

U.S. PATENT DOCUMENTS

| | | | |
|---|---|---|---|
| 5,109,844 A | 5/1992 | de Juan, Jr. et al. | |
| 5,599,592 A | 2/1997 | Laude | |
| 5,935,155 A | 8/1999 | Humayun et al. | |
| 6,387,518 B1 * | 5/2002 | Wolfer et al. | 428/447 |
| 6,400,989 B1 | 6/2002 | Eckmiller | |
| 6,458,157 B1 | 10/2002 | Suaning | |
| 6,596,569 B1 | 7/2003 | Bao et al. | |
| 6,743,345 B2 * | 6/2004 | Belouet et al. | 205/91 |
| 6,878,643 B2 * | 4/2005 | Krulevitch et al. | 438/780 |
| 7,127,301 B1 * | 10/2006 | Okandan et al. | 607/116 |

FOREIGN PATENT DOCUMENTS

| | | |
|---|---|---|
| EP | 0 442 674 A2 | 8/1991 |
| EP | 1 371 754 A1 | 12/2003 |
| WO | WO 97/33307 | 9/1997 |

OTHER PUBLICATIONS

Silicones—Published for the Plastics Institute, ILIFFE Books Ltd., (1962), p. 79-84).*
Vince, V., et al., Biocompatibility of Platinum-Metalized Silicone Rubber: in Vivo and in Vitro Evaluation, J. Biomater. Sci. Polymer Edn. 2004, pp. 173-188, vol. 15, No. 2.
Laude, L.D., et al., Laser Metallization for Microelectronics and Bio-Applications, Photon Processing in Microelectronics and Photonics, 11, 2003, pp. 578-586, SPIE, vol. 4977.

* cited by examiner

*Primary Examiner*—Kuo-Liang Peng
(74) *Attorney, Agent, or Firm*—Scott B. Dunbar; Gary Schnittgrund; Tomas Lendvai

(57) ABSTRACT

A polymer layer comprising silicone contains oxide particles of $SiO_2$, $TiO_2$, $Sb_2O_3$, $SnO_2$, $Al_2O_3$, $ZnO$, $Fe_2O_3$, $Fe_3O_4$, talc, hydroxyapatite or mixtures thereof and one or more metal traces embedded in the polymer layer, where the metal trace is bonded to the polymer silicon metal bond.

8 Claims, 12 Drawing Sheets

POLYMER COMPRISING SILICONE AND AT LEAST ONE METAL TRACE

CROSS-REFERENCE TO RELATED APPLICATIONS

This application claims the benefit of 60/811,683, "Polymer Layer Comprising Silicone and at Least One Metal Trace and a Process of Manufacturing the Same," filed Jun. 7, 2006, and this application claims the benefit of U.S. application Ser. No. 11/270,907, "Polymer Layer Comprising Silicone and at Least One Metal Trace and a Process of Manufacturing the Same", filed Nov. 10, 2005, the disclosures of both are incorporated herein by reference.

BACKGROUND OF THE INVENTION

1. Field of the Invention

The present invention relates to a silicone polymer material comprising at least one metal trace and a process of manufacturing the same.

2. Description of Related Art

In U.S. Pat. No. 6,743,345 "Method of Metallizing a Substrate" to Christian Belouet et al. a process for metallizing a substrate is disclosed, comprising coating the part with a precursor composite material layer consisting of a polymer matrix doped with photoreducer material dielectric particles; irradiating the surface of the substrate with a light beam emitted by a laser; and immersing the irradiated part in an autocatalytic bath containing metal ions, with deposition of the metal ions in a layer on the irradiated surface, and wherein the dimension of the dielectric particles is less than or equal to 0.5 µm. The process includes three steps. The first step is to coat the substrate part with a precursor composite material layer consisting of a polymer matrix doped with photoreducer material dielectric particles. The second step is to irradiate the surface of the substrate with a light beam emitted by a laser. The third step is to immerse the irradiated part in an autocatalytic bath containing metal ions, with deposition of the metal ions in a layer on the irradiated surface, wherein the dimension of the dielectric particles is less than or equal to 0.5 µm.

In U.S. Pat. No. 5,599,592 "Process for the Metallization of Polymer Materials and Products Thereto Obtained" to Lucien D. Laude a positive metallization process for metallizing a polymer composite piece containing a polymer material and oxide particles is disclosed, the oxide particles being made of one or more oxides, comprising three successive steps. The first step consists of the irradiation of a surface area of a polymer piece to be metallized with a light beam emitted by an excimer laser. The polymer piece is made from a polymer material and oxide particles. The oxide particles are made from one or more oxides. The second step consists of immersing the irradiated polymer piece in at least one autocatalytic bath containing metal ions. The immersion induces the deposit of the metal ions onto the irradiated surface area to form a metal film on the surface area, resulting in the selective metallization of the surface area of the polymer piece. The third step consists of thermally processing the metallized polymer piece to induce diffusion of the deposited metal film into the polymer material of the polymer piece. The disclosure of U.S. Pat. No. 5,599,592 is incorporated herein by reference.

Lucien D. Laude et al. report that excimer lasers are effective tools in engraving ceramics and polymers, changing irreversibly the surface of the irradiated material, and restricting these effects to specific areas of interest. See L. D. Laude, K Kolev, Cl. Dicara and C. Dupas-Bruzek "Laser Metallization for Microelectronics for Bio-applications", Proc. of SPIE Vol. 4977 (2003), pp 578-586.

In U.S. Pat. No. 5,935,155 "Visual Prosthesis and Method of Using Same" to Mark S. Humayan et al. it is disclosed a visual prosthesis, comprising means for perceiving a visual image, said means producing a visual signal output in response thereto; retinal tissue stimulation means adapted to be operatively attached to a retina of a user; and wireless visual signal communication means for transmitting said visual signal output to said retinal tissue stimulation means.

In U.S. Pat. No. 6,878,643 "Electronic Unit integrated Into a Flexible Polymer Body" to Peter a. Krulevitch et al. it is disclosed a method of fabricating an electronic apparatus, comprising the steps of providing a silicone layer on a matrix, providing a metal layer on said silicone layer, providing a second layer of silicone on said silicone layer, providing at least one electronic unit connected to said metal layer, and removing said electronic apparatus from said matrix wherein said silicone layer and said second layer of a silicone provide a spherical silicone body.

J. Delbeke et al. demonstrate that silicone rubber biocompatibility is not altered by the metallization method. See V. Cince, M.-A. Thil, C. Veraart, I. M. Colin and J. Delbeke "Biocompatibility of platinum-metallized silicone rubber: in vivo and in vitro evaluation", *J. Biomater. Sci. Polymer Edn*, Vol. 15, No. 2, pp. 173-188 (2004).

There is a need and a high desire for a soft and biocompatible polymer layer with high insulation properties containing embedded very fine metal traces. There is further a need and a high desire for an economical and ecological process of manufacturing such polymer layers.

SUMMARY OF THE INVENTION

The present invention is a polymer layer comprising silicone containing oxide particles of $SiO_2$, $TiO_2$, $Sb_2O_3$, $SnO_2$, $Al_2O_3$, $ZnO$, $Fe_2O_3$, $Fe_3O_4$, talc, hydroxyapatite or mixtures thereof and at least one metal trace embedded in the polymer layer bonded by a silicone metal bond.

Another aspect is a flexible electrode array comprising silicone containing oxide particles of $SiO_2$, $TiO_2$, $Sb_2O_3$, $SnO_2$, $Al_2O_3$, $ZnO$, $Fe_2O_3$, $Fe_3O_4$, talc, hydroxyl-apatite or mixtures thereof and at least one metal trace embedded in said polymer layer.

DETAILED DESCRIPTION OF THE INVENTION

Figure 1:
FIG. 1 depicts a cross-sectional view of a substrate.

The present invention relates preferably to the metallization of a polymer, generally Si-based polymers. A more preferred embodiment of the present invention is the metallization of polymers with platinum (Pt). The most preferred embodiment is a polymer layer comprising at least one metal trace embedded in the polymer layer.

The preferred polymer of the present invention is a silicone containing polymer. Silicone means, in view of the present invention, any and all possible silicone elastomer formulations, silicone copolymers, silicone-silicone copolymers, silicone-hydrocarbon copolymers, silicone block polymers, silicone block copolymers, silicone rubbers or mixtures thereof. Silicone may contain any type and amount of additives.

The most common method for preparing silicones involves the reaction of a chlorosilane with water. This produces a hydroxyl intermediate, which condenses to form a polymer-type structure. The basic reaction sequence is represented as follows:

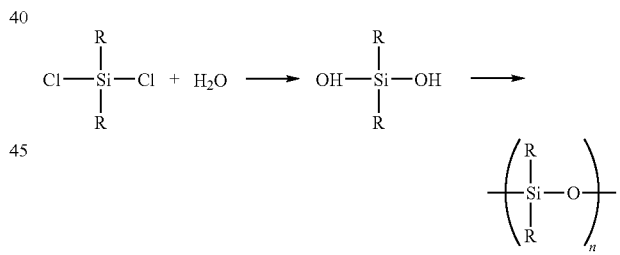

n is an integer>1.

Other raw materials such as alkoxysilanes can be used as well. Chlorosilanes and other silicone precursors are synthesized by a direct process, involving the reaction of elemental silicone with an alkyl halide as follows:

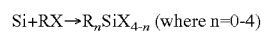

Silicone elastomers have high molecular weight, generally greater than 500,000 g/mol. The production of these types of materials requires di-functional precursors, which form polymer structures. Mono and tri-functional precursors form terminal structures and branched structures respectively.

Silicone rubbers contain usually cured additives like peroxides such as benzoyl peroxide, 2,4-dichlorobenzoyl peroxide, t-butyl perbenzoate and dicumyl peroxide. Alkyl hydroperoxides and dialkyl peroxides have also been used successfully with vinyl containing silicones.

Hydrosilylation or hydrosilation is an alternative curing method for vinyl containing silicones and utilizes hydrosilane materials and platinum containing compounds for catalysts. It is a two part process requiring mixing of two separate components, with the resulting material having a limited shelf life. Curing does not produce volatiles and heat cured conventional silicones with high tear strengths can be cured in this way.

Reinforcing fillers are added to improve the otherwise poor tensile strength of silicones. Silica, in the form of silica fume, silica foam, or fumed silica with particle sizes in the range 10 nm-40 nm is the most preferred filler, although carbon black has been used. Fillers do interact with the vulcanisate, forming a pseudo-vulcanization. This can occur either during mixing and creep hardening or in storage and bin ageing.

Fumed silica has unique properties and is commonly added to liquids/coatings and solids to improve various properties. Fumed silica has chain-like particle morphology. In liquids, the chains bond together via weak hydrogen bonds forming a three dimensional network, trapping liquid and effectively increasing the viscosity. The effect of the fumed silica can be negated by the application of a shear force for example mixing, brushing, spraying etc., allowing the liquid to flow, level out and permit the escape of entrapped air.

One production method for the production of fumed silica involved a continuous flame hydrolysis technique. It involves the conversion of silicon tetrachloride ($SiCl_4$) to the gas phase using an oxygen-hydrogen flame. It then reacts with water to yield silica ($SiO_2$) and hydrochloric acid thus:

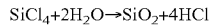

$$SiCl_4 + 2H_2O \rightarrow SiO_2 + 4HCl$$

HCl can easily be separated as it remains in the gas phase, while $SiO_2$ is solid in the form of fumed silica.

Silicone can be in large variation of shapes and forms, such as thin sheets obtained by spun coating or spray coating, foil obtained by lamination or molding, bloc molded pieces, distributed silicone, silicone mixed with thermoplastic material.

The present invention provides a cured silicone layer which has a preferred thickness of 10 micrometers (μm) to 80 μm, preferably 20 μm to 40 μm. This layer contains laser-drawn traces up to 10 μm to 20 μm traces or pads with a dimension of 100 μm to 200 μm which are filled with metallized deposit.

The present invention further provides a silicone layer which has a preferred thickness of 15 μm to 25 μm. This layer contains laser-drawn traces having a width of to 10 μm to 20 μm which are filled with metallized deposit, preferably with Pt. Alternately, the polymer comprises metal traces of one or more of the following metals: titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, or gold, or an alloy of two or more metals, or a combination of two or more alloys or metal layers thereof. This layer contains further a second 15 μm to 25 μm thick silicone layer covering the once metallized first silicone layer. After curing that second silicone layer an optimum silicone-to-silicone adhesion of the second silicone layer provides a fully protected cover to the metallized silicone layer. A full silicone-encapsulation of the once produced metal traces is thereby obtained.

The present invention provides overlapping silicones with different formulations. In the previous aspects of the present invention, silicones have a formulation that contains generally a variable amount of fumed silica (silica foam) that serves to strengthen the polymeric structure in various ways. It also favors the electroless-metallization process and improves substantially the mechanical behavior of metallized silicone. In this aspect of the present invention, the final silicone cover remains unmetallized and serves solely for the purpose of protecting and insulating the underlying metallized silicone layers. That silicone cover may be formed with a silicone that is different from the silicone that has been used for the underlying layers. In particular, it may not contain silica foam at all and may then be more readily applied even to very small layer thickness. Therefore, a silicone cover of 15 μm to 20 μm is formed on the metallized silicone layer. That silicone cover is formed with a silica foam free silicone that is spun onto the metallized silicone before curing as above.

In the metallization process a non-organic powder is dispersed in any given polymer, for example polyamide. The non-organic powder is for example at least one oxide of antimony, aluminum, iron, zinc or tin. The oxide particles have variable particle sizes, preferably smaller than about 50 μm. The concentration of the oxide particles in the polymer exceeds about 1 vol.-% or 1 wt.-%. Alternatively, the polymer comprises one or more of the following metals: titanium, tantalum, chromium, iridium, palladium, platinum, silver, or gold, or an alloy of two or more metals, or a combination of two or more alloys or metal layers thereof.

The surface of the polymer material is irradiated with the light beam emitted by a laser. The light is emitted preferably in the ultraviolet wavelength range, during a very short duration or pulse and repeated if necessary at regular time intervals. The pulsed emission has preferably high energy, for example, between 0.05 J and 1.0 J. It contains a very large number of photons. It may also operate at a wavelength below or equal to about 350 nm which corresponds to photon energy approximately equal to or larger than 3.5 eV. The desired emission may be obtained from an excimer laser source emitted during about 10 ns, at a wavelength of about 248 nm which corresponds to photon energy of 5.0 eV.

The laser beam may be passed through a mask having a specific geometry, and projected upon focalization onto the surface of the material to be treated. A desired processing is obtained beyond a given energy density of about 0.5 $J/cm^2$, or fluence, and as a function of the material optical properties and the laser photon energy.

In case of pure silicone, UV laser irradiation may produce two effects that depend on both fluence and photon energy.

At 248 nm, therefore at 5 eV, the silicone undergoes partial decomposition by breaking the Si—C bonds. This results in ablation of the C-radicals but leaves unaffected the Si—O bonds of the polymer backbone.

At lower wavelengths for example at 193 nm, therefore at 6.2 eV, the silicone undergoes total decomposition by breaking both Si—C and Si—O bonds. This results in a full ablation of silicone, typically at a rate of some 0.5 μm per pulse at 0.5 $mJ/cm^2$, and irrespective of the silicone formulation.

In the case of silicone containing silica, for example silica foam, the 248 nm laser radiation has no effect on the silica particles but the 193 nm does, which leads to a complete ablation of the silicone and its silica additive.

In the second part of the process, silicone treated with the 248 nm laser is immersed in an autocatalytic bath that contains metal ions, for example $Ni^{2+}$, $Cu^{2+}$, or $Pt^{2+}$. These ions are selectively driven to deposit and react on the partially decomposed silicone structure regardless if the treated silicone contains an additive, for example silica foam, or not. The reaction between metal ions and the polymer results in covalent bonding on the Si atoms of the polymer that lost their C-radicals upon irradiation. In the absence of silica foam, metallization occurs but with a poor adhesion of the metallized silicone part. The presence of silica foam enforces substantially the metallized silicone that is obtained after laser treating at 248 nm, since silica remains unaffected at 248 nm.

In contrast, irradiating silicone at 193 nm provides a very efficient way to fully and exclusively ablate silicone, containing silica foam or not. In particular, irradiating silicone at 193 nm allows opening clean and well defined cuts, grooves, blind holes or vias through it. Silicone parts engraved by 193 nm do not metallize by immersing in an autocatalytic bath.

During immersion of the laser processed surface into the autocatalytic bath, metallization is restricted to the actual laser treated surface. The incubation time measures the period of time which is necessary to form a continuous metal film on the composite surface. After that time, the metal deposition, which is usually 10 μm to 20 μm per hour for Ni, may develop perpendicularly to the surface in a most efficient manner.

The advantages of the process of the present invention result directly from the use of an intense and pulsed ultraviolet light beam, as for instance the one emitted by an excimer laser source working at a wavelength equal or inferior to 308 nm. All other light sources working in the visible or infrared range, in pulsed or continuous regime are inactive on silicone.

The preferred irradiation source according to this invention is an excimer laser. The preferred excimer laser performs engraving at about 248 nm with partial decomposition of silicone and allows metallization. The laser pulse duration is in the range of 1 ns to 40 ns by steady or scanning irradiation. In comparison engraving below about 200 nm performs full ablation but no metallization can follow after the ablation.

A silicone layer is spun on a clean glass plate and cured in an oven. The layer may have a near constant thickness at about 40 μm across the glass substrate. The thickness depends on spinning conditions and the content of additives. The higher the content of additives is the more difficult is the spinning. This layer is then scanned with a focused 248 nm excimer laser beam working at a sufficient fluence that allows partial decomposition of the silicone material down to some 10 μm to 15 μm into the layer. The laser processed silicone layer, on its glass substrate, is further immersed in an electroless bath containing metal ions. Subsequently, the latter ions condense solely on the laser-processed areas of the silicone layer where they contribute to form metallized deposits precisely in the laser-drawn areas and remain embedded in the silicone layer without touching the glass substrate underneath.

After preparing the metallized silicone layer on a glass substrate, a second 20 μm thick silicone layer is spun on the once metallized first silicone layer and cured in oven. An optimum silicone to silicone adhesion of the latter is thus achieved that provides a fully protected cover to the metallized silicone layer. The set of two silicone layers may then be pulled from the glass substrate and materializes the full silicone-encapsulation of the once produced metal traces.

Silicones have a formulation that contains generally a variable amount of silica foam additive that serves to strengthen the polymeric structure in various ways. This additive or other form of silica for example fiber also favors the electroless-metallization process and improves substantially the mechanical behavior of metallized silicone. However, the final silicone cover remains un-metallized and serves solely the purpose of protecting the underlying metallized layers. That silicone cover may be formed with a silicone that is different from the one silicone that has been used for the other underlying layers. In particular, it may not contain silica at all and may then be more readily spun, even to very small layer thickness. Therefore, a silicone cover of 20 μm is formed on the last metallized silicone layer. That silicone cover is formed with a silica-free silicone that is spun onto the metallized silicone before curing as above.

The electroless Pt-metallization proceeds via forming a thin so-called black metal film and then goes on a second step of Pt-deposit that thickens the metal layer. That second step is extremely slow being impaired in particular with the formation of H-bubbles on a quite uneven metallizing surface; bubbles that tend to obliterate the surface and limit its direct contacting to the electroless bath. Accelerating this second metallization step may be performed as follows.

After having initiated that second step, the silicone layer on its substrate is removed from the bath and its surface is blown for a few seconds with a hot air jet as produced by a standard air gun. The jet cleans up the surface and heats up the metal deposit. The layer is then returned to the bath for a period of 5 min to 10 min before being removed again from the bath, re-blown as before and re-immersed in the bath. The process is repeated regularly (and automated eventually) at 5 min to 10 min intervals until the necessary metal thickness has been attained. With this transient heat procedure, time reduction from 2 h to 3 h to 30 min in the process of Pt-metallizing is substantial and the metal deposit may attain a large thickness that may not be accessible without it.

The present invention will be further illustrated by the following exemplary explanation of the figures, but it is to be understood that the invention is not meant to be limited to the details described herein. The figures explain the preferred process for producing a silicone layer containing embedded Pt traces.

FIG. 1 depicts a cross-sectional view of a substrate (1). The substrate (1) is a rigid supporting substrate preferably made of glass, molded silicone, ceramic, semiconductor, at least one metal, or at least one metal alloy.

Figure 2:
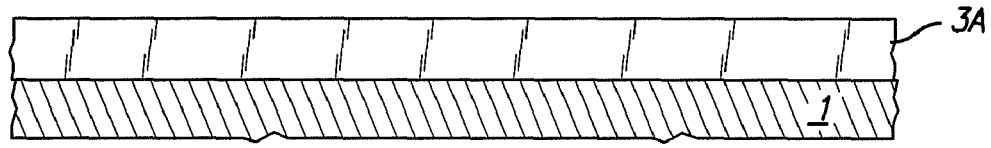
FIG. 2 depicts a cross-sectional view of a substrate and a first polymer layer after curing.

FIG. 2 depicts a cross-sectional view of the substrate (1) and a first silicone layer (3a) after curing. The silicone is preferably applied and distributed by spun coating. Then the sample is heat treated to perform curing of the silicone layer (3a). The silicone layer (3a) is about 20 μm thick.

Figure 3:
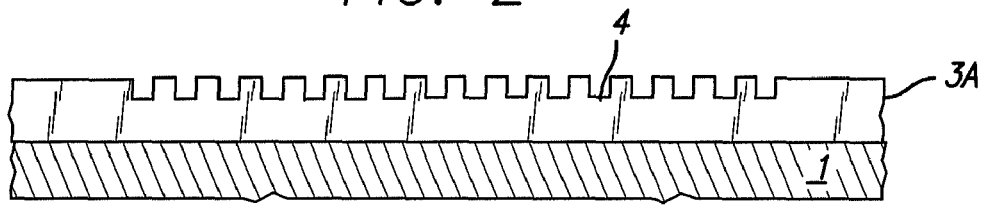
FIG. 3 depicts a cross-sectional view of a substrate and a cured first polymer layer after laser treatment.

FIG. 3 depicts a cross-sectional view of a substrate (1) and a cured first silicone layer (3a) after laser treatment. The desired emission may be obtained from an excimer laser source emitting during about 10 ns, at a wavelength of about 248 nm which corresponds to photon energy of 5 eV. The threshold energy density may be obtained by focalizing the laser beam on the irradiated surface and is usually at about 0.5 J/cm$^2$. The laser beam cuts traces (4) with a preferable trace width of 5 μm to 15 μm.

Figure 4:
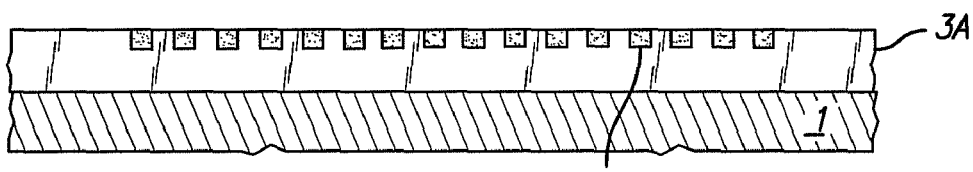
FIG. 4 depicts a cross-sectional view of a substrate and a cured first polymer layer after metallization whereby metal traces are obtained.

FIG. 4 depicts a cross-sectional view of a substrate (1) and a cured first silicone layer (3a) after metallization of the engraved traces (4) whereby Pt traces (5) are obtained. The silicone layer (3a) is immersed in a Pt autocatalytic bath whereby deposition of Pt is induced on.

Figure 5:
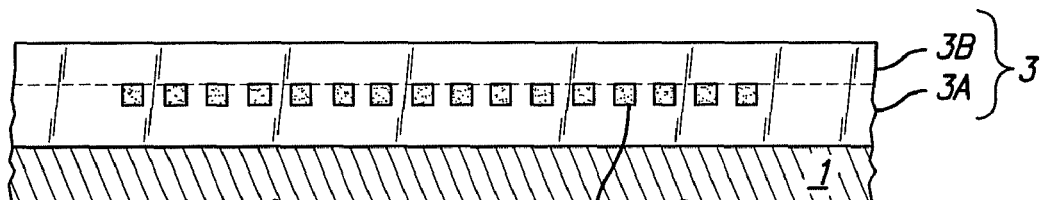
FIG. 5 depicts a cross-sectional view of a substrate and a cured first polymer layer after disposing a second polymer layer on top of the first polymer layer and the metal traces.

FIG. 5 depicts a cross-sectional view of a substrate (1) and a cured first silicone layer (3a) after disposing a second silicone layer (3b) on top of the first silicone layer (3a) and the Pt traces (5). The second silicone layer (3b) is of 15 μm to 20 μm thick.

The used silicones have a formulation that contains generally a variable amount of silica foam additive that serves to strengthen the polymeric structure in various ways. It also favors the electroless-metallization process and improves substantially the mechanical behavior of metallized silicone. The final silicone cover can remain un-metallized and serves solely to the purpose of protecting from ambient of the underlying metallized layers. That silicone cover may be formed with a silicone that is different from the one silicone that has been used for the other underlying layers. In particular, it may not contain silica at all and may then be more readily spun, even to very small layer thickness. Therefore, the silicone cover can be formed with a silica-free silicone that is spun onto the multi-layered metallized silicone before curing as above.

Figure 6:
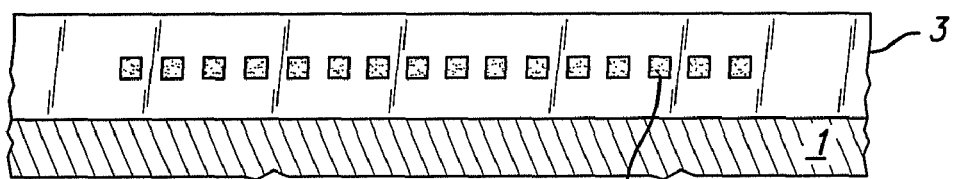
FIG. 6 depicts a cross-sectional view of a substrate and a cured first polymer layer and metal traces after curing the second polymer layer.

FIG. 6 depicts a cross-sectional view of a substrate (1) and a cured first silicone layer (3a) and Pt traces (5) after curing the second silicone layer (3b).

Figure 7:
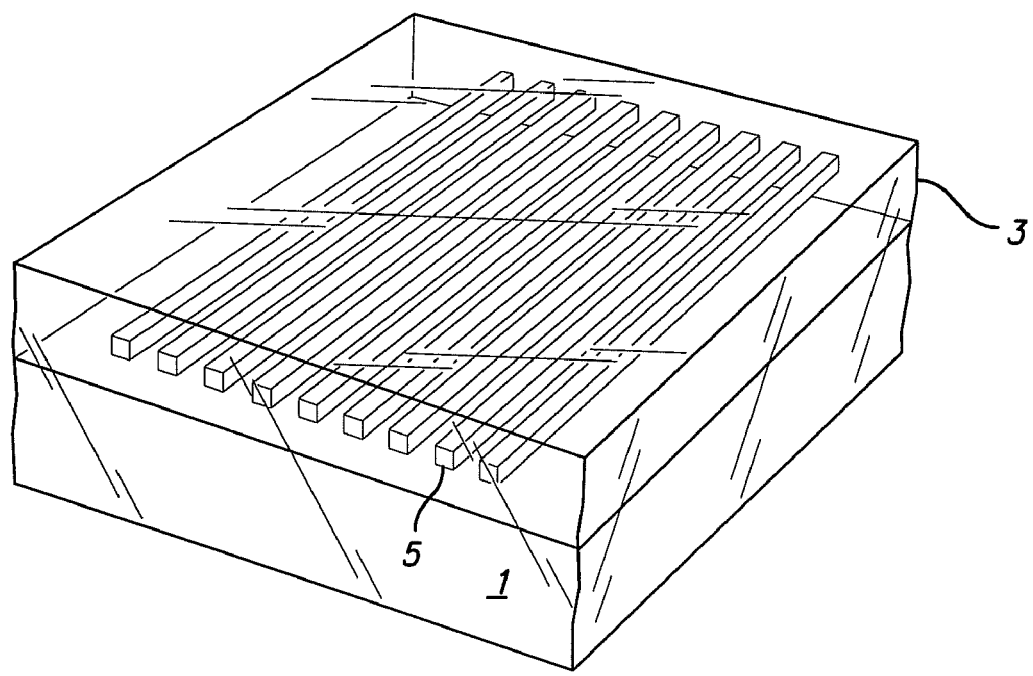
FIG. 7 depicts a perspective view of a cured polymer layer with one embedded series of metal traces as shown in FIG. 6.

FIG. 7 depicts a spherical view of a substrate (1) and a cured silicone polymer layer (3) with one embedded series of Pt traces (5). The first silicone layer (3a) and the second silicone layer (3b) become one silicone layer (3) after curing as shown in FIG. 6.

Figure 8:
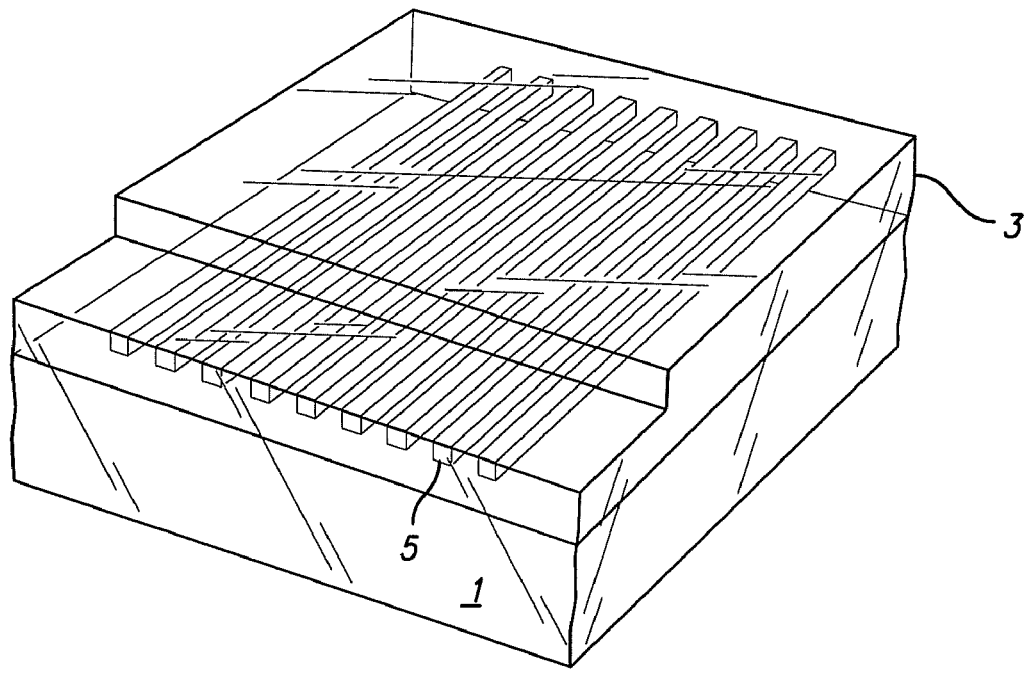
FIG. 8 depicts a perspective view of a cured polymer layer with one embedded series of metal traces as shown in FIG. 6 after a cut out of the polymer.

FIG. 8 depicts a spherical view of a cured silicone polymer layer (3) with one embedded series of Pt traces (5) after a cut out of the silicone as performed by laser irradiating at about 193 nm to enable connection of the Pt traces (5) to external electrodes or other devices.

Figure 9:
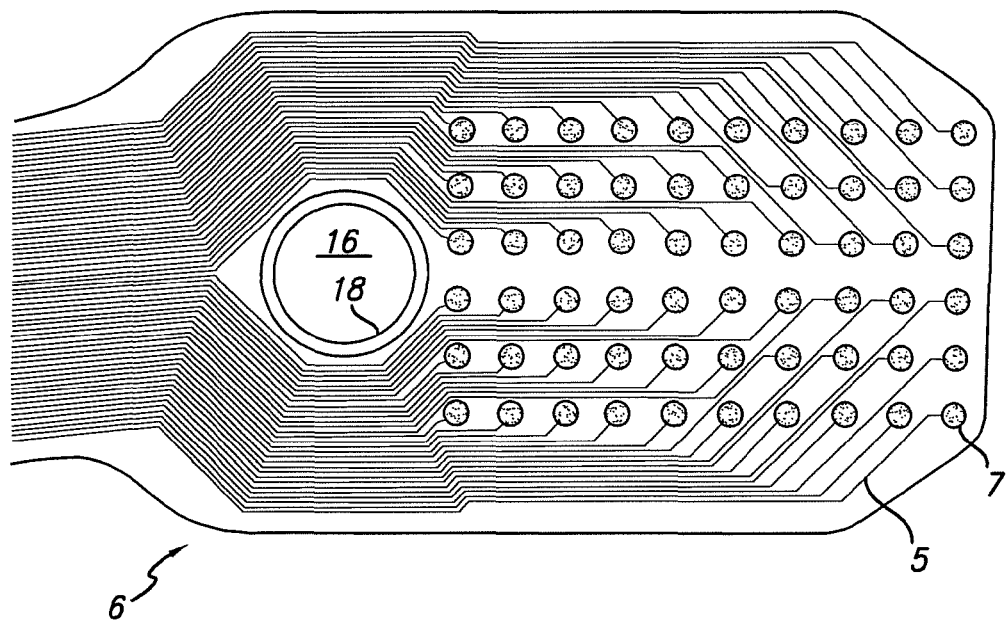
FIG. 9 depicts a top view of a flexible circuit electrode array.
Figure 10:
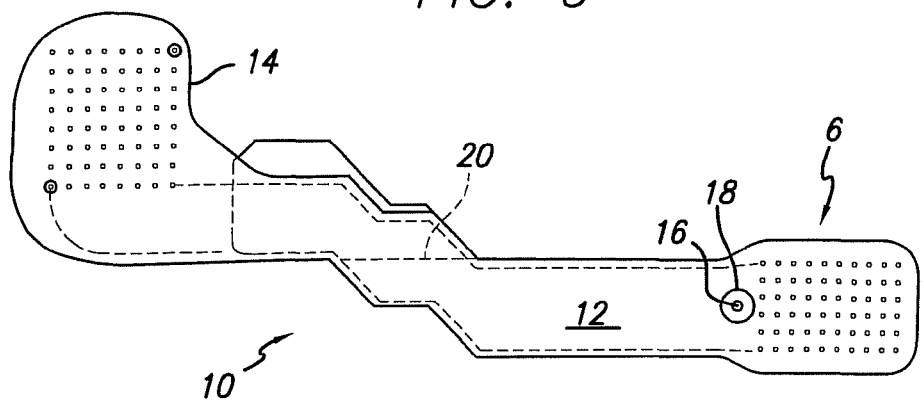
FIG. 10 depicts a top view of a body comprising a flexible circuit electrode array, a flexible circuit cable and a bond pad before it is folded.
Figure 11:
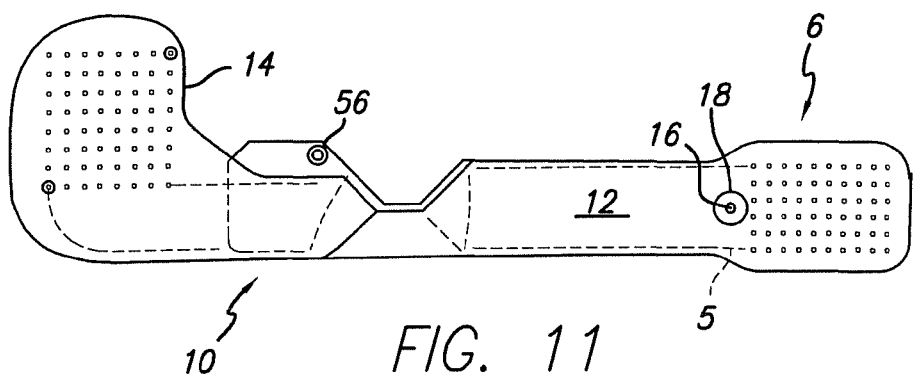
FIG. 11 depicts a top view of a body comprising a flexible circuit electrode array, a flexible circuit cable and a bond pad after it is folded.

FIG. 9 depicts an enlarged top view of a flexible circuit electrode array (6) which is a part of the body (10) as shown for example in FIGS. 10 and 11. The preferred positions of the electrodes (7) and the preferred wiring by the platinum trace (5) both embedded in the silicone layer (3) are shown in FIG. 9. The trace metal preferably contains platinum. The electrodes (7) contain preferably platinum. The preferred flexible electrode array (6) of the present invention comprises silicone polymer (3) containing $SiO_2$ in which platinum traces (5) are embedded and which contains platinum electrodes (7).

FIGS. 10 and 11 depict a body (10) containing the flexible circuit electrode array (6), a flexible circuit cable (12) and the interconnection pad (14). At one end of the flexible circuit cable (12) is an interconnection pad (14). At the other end of the flexible circuit cable (12) is the flexible circuit electrode array (6). Further, an attachment point (16) is provided near the flexible circuit electrode array (6). A retina tack (not shown) is placed through the attachment point (16) to hold the flexible circuit electrode array (6) to the retina. A stress relief (18) is provided surrounding the attachment point (16). The stress relief (18) may be made of a softer polymer than the flexible circuit, or it may include cutouts or thinning of the polymer to reduce the stress transmitted from the retina tack to the flexible circuit electrode array (6). FIG. 10 depicts that the flexible circuit cable (12) is formed in a dog leg pattern so then when it is folded at fold (20) it effectively forms a straight flexible circuit cable (12) with a narrower portion at the fold (20) for passing through the sclerotomy. FIG. 11 depicts the flexible circuit electrode array (6) after the flexible circuit cable (12) is folded.

Figure 12:
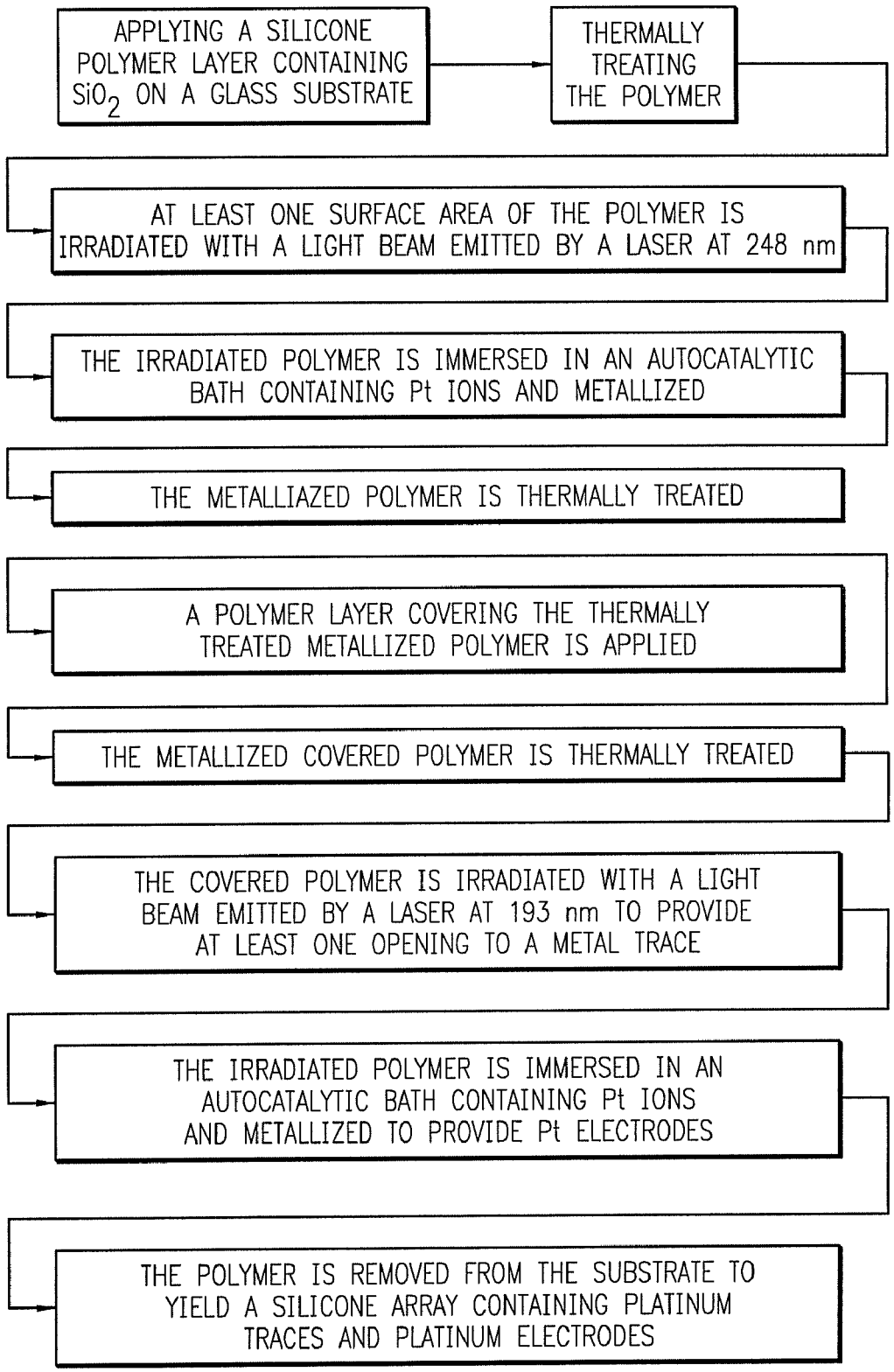
FIG. 12 depicts a flow chart explaining an example of the process.

FIG. 12 depicts a flow chart which is an example for the manufacturing of a flexible electrode array containing a polymer comprising silicone, $SiO_2$, and platinum traces and electrodes.

The present invention provides a multi-layer metallized silicone. The second and last layer is laser irradiated and metallized as previously. The new metallized traces in that second layer remain within the engraved part of that layer down to 5 µm to 10 µm. The traces are still separated from the underlying metallized traces in the first layer by some 10 µm. Any undesired interconnects in between the two sets of metallized traces are avoided. The two-layer silicone structure is then covered with a final, cured virgin silicone layer. A silicone-encapsulated 3-D structure that contains two sets of independent metallized Pt-traces is obtained.

The present invention provides interconnection in multi-layered silicone 3-D structure. In order to get access to the underlying Pt-traces, irradiation with the same excimer laser source working at 248 nm is performed onto the cover at an area that overlaps a section of an underlying Pt-trace. Decomposition of silicone is performed at the site and maintained upon repeated pulsed-irradiation. The procedure drives silicone out of that area and cuts the layer until reaching the underlying Pt-trace to open a window to the embedded Pt-circuit. The window is filled with Pt after metallization down to the underlying trace. A new laser-irradiation of that second silicone layer that is now equipped with the metallized window is performed along a path that crosses the metallized window. A further immersion in the autocatalytic bath results in the metallization of the path while bringing additional metal to the window. In that way, a direct interconnect is obtained between the upper lying trace in the second silicone layer and the lower lying trace in the first one.

The present invention provides overlapping silicones with different formulations. In the previous aspects of the present invention, silicones have a formulation that contains generally a variable amount of fumed silica (silica foam) that serves to strengthen the polymeric structure in various ways. It also favors the electroless-metallization process and improves substantially the mechanical behavior of metallized silicone. In this aspect of the present invention, the final silicone cover remains un-metallized and serves solely for the purpose of protecting the underlying metallized layers from ambient. That silicone cover may be formed with a silicone that is different from the one silicone that has been used for the other underlying layers. In particular, it may not contain silica foam at all and may then be more readily applied even to very small layer thickness. Therefore, a silicone cover of 15 µm to 20 µm is formed on the last metallized silicone layer. That silicone cover is formed with a silica foam free silicone that is spun onto the multi-layered metallized silicone before curing as above.

The present invention provides silicone with a spherical geometry. The cured silicone surface with spherical geometry is scanned with an excimer laser and followed by a subsequent platinum-metallization of the resulting laser-produced trace. A second silicone layer is further spun on this metallized silicone surface and cured in an oven. That silicone structure is not planar but curved.

The present invention provides metallized spherical, silicone molded substrates. Silicone rubber is injected in a hemispherical mold. After de-molding the resulting silicone piece, a laser beam is scanned on its molded hemispherical surface and the resulting laser-processed traces are metallized with platinum.

The present invention provides the metallizing of an expanded silicone layer for enhanced metal imbedding. A silicone is applied on a glass cylinder. After inscribing the laser-processed traces on the convex, expanded silicone surface, the silicone layer on the glass cylinder is brought in an electroless Pt bath for metallization of the traces. The metallized silicone layer is detached from the glass cylinder and recovers its original planar geometry. The expanded Pt-traces contract enclosing the metal parts into silicone and providing an enhanced integration of these traces into the silicone layer.

The present invention relates to an improved process for positive metallization of a polymer surface. In this metallization process a non-organic powder is dispersed in any given polymer, for example polyamide. The non-organic powder is for example at least one oxide of antimony, aluminum, iron, zinc or tin. The oxide grains have variable grain sizes, preferably smaller than 50 µm. The concentration of the oxide grains in the polymer exceeds about 1 Vol.-% or 1 wt.-%.

In the first step of the process the surface of the polymer material or composite is irradiated with the light beam emitted by a laser. The light is emitted preferably in the ultraviolet area, during a very short duration or pulse and repeated if necessary at regular time intervals. The pulsed emission has preferably high energy, for example, between 0.05 J and 0.2 J. It contains a very large number of photons. It may also operate at a wavelength below or equal to 350 nm which corresponds to photon energy approximately equal to or larger than 3.5 eV. The desired emission may be obtained from an excimer laser source emitting during 20 nanoseconds, at a wavelength of 248 nm which corresponds to photon energy of 5 eV. The threshold energy density may be obtained by focalizing the laser beam on the irradiated surface and is usually at about 0.5 J/cm$^2$.

The process of radiation has two effects if the above given energy density, threshold energy, and the value which depends on the nature and concentration of the oxide grains in the composite are applied:

a) the base material itself, for example the polymer, undergoes a superficial ablation of some 0.2 micrometer (μm) per pulse; and b) depending on the choice of the incorporated granular substance, the same radiation creates at the surface of the oxide grains a high concentration of polarized defects.

The defects are a consequence of breaking some of the interatomic bonds at the surface of the surface grains. They result from the combined actions of the electronic excitations which take place within these bonds following the absorption of the laser photons by the grains themselves. The actual concentration of such defects at the surface of the oxide grains is proportional to the laser energy density as resulting from the laser beam focalization at the surface of the composite.

In the second step of the process, and without any other intermediate steps, the laser-treated material is directly immersed in an autocatalytic bath containing metal ions for example $Pt^{2+}$. The metal contained in the bath is then selectively driven to deposit on those sections of the polymer surface which have been previously irradiated by the laser beam and which contain the polarized defects produced by the same irradiation. The present invention does not have to apply any substances containing Palladium to control the $Pt^{2+}$ polymer surface metallization due to the defects on the oxide grains. The metallization is directly induced by the superficial defects which are laser-created on the oxide grains present at the composite surface.

The duration of the incubation time decreases when the laser energy density increases. The thickness of the Pt deposition of 20 or 5 micrometers per hour in a Pt bath after the incubation is approximately proportional to the actual immersion duration.

The interface between the composite and the metal film is rough as a result from the partial ablation of the polymer surface. The interstitial coupling, either by covalent or ionic strong bonds, of the metal ions from the autocatalytic bath onto the superficial grain defects of that roughened surface is selective and strong. The adhesion of the metal deposition onto the polymer is remarkably high. The adhesion of the metal film onto the polymer surface is performed by the superficially metallized oxide grains which are present at the composite surface. The resulting metal adhesion attains then some 10 MPa.

The adhesion of the metal film to the polymer surface may be further increased by letting the metal diffusing towards the inner part of the polymer. This step can be performed by selectively heating the metal film during a short period of time for example in a microwave oven. During that period, the polymer and the other non-metallic components of the complex formed by the polymer and the metal film are not affected by the waves emitted in the oven and, therefore do not heat. The emitted waves selectively heat the metal which may then diffuse in part into the polymer.

The modifications which are produced at the polymer surface by the ultraviolet light beam are restricted to those areas which have been irradiated. The precise definition of the limits to those areas is further proportioned to the actual wavelength which is preferably chosen to be lesser than 350 nm.

The surface sensitivity to the laser radiation depends for every polymer formulation on the incident laser energy density. During immersion of the laser processed surface into the autocatalytic bath, metallization is at first restricted to the actual surface of the oxide grains which emerge from the composite. Then, metallization proceeds at random from those grain sites and covers progressively the whole of the laser processed surface area of the composite. The incubation time measures the period of time which is necessary to form a continuous metal film on the composite surface. After that time, the metal deposition, which is usually 20 micrometers per hour for Ni, may develop perpendicularly to the surface in a most efficient manner.

The actual thickness of the metal film increases homogeneously all over the laser processed polymer surface whatever the polymer formulation and the initial laser processing is applied. The laser energy density which is utilized for irradiation can be very for a given polymer. The areas which are irradiated at high energy density have an incubation time at the time of immersion in the autocatalytic bath of some 10 minutes. The areas which are irradiated at lower energy density have an incubation time of about 50 minutes.

The process of the present invention allows producing metal films with varied thicknesses on the same polymer surface during one single immersion of the irradiated polymer in an autocatalytic bath.

The advantages of the process of the present invention result directly from the use of an intense and pulsed ultraviolet light beam, as for instance the one emitted by an excimer laser source working at a wavelength equal or inferior to 308 nm. All other light sources working in the visible or infra-red range, in pulsed or continuous area, cannot produce structural or compositional, polarized, defects on the oxide grains which are incorporated into the polymer, all such defects which are necessary in the presently described process for the metallization of specifically formed polymers.

The preferred irradiation source according to this invention is an excimer laser. The preferred excimer laser performs engraving at 248 nm with partial decomposition and allows metallization. In comparison engraving below 200 nm performs full ablation but no metallization can follow after the ablation. The laser pulse duration is in the range of ins to 40 ns by steady or scanning irradiation.

The preferred metallization includes the following steps
a) PMMA coating prior irradiation
b) standard electroless process with platinum salt
c) multi-bath procedure at 50° C.
d) intercalated transient heat treatment
e) dissolving PMMA after metallization The overall process of metallizing silicone involves the following preferred process steps.

Spinning Silicone

A silicone layer is spun on a clean glass plate and cured in an oven. The layer has a near constant thickness at 40 μm across the glass substrate. This layer is then scanned with a focused 248 nm excimer laser beam working at a sufficient fluence that allows partial decomposition of the silicone material down to some 10 μm-15 μm into the layer. The laser processed silicone layer, on its glass substrate, is further immerged in an electroless bath containing Pt ions. Subsequently, the latter ions condense solely on the laser-processed areas of the silicone layer where they contribute to form metallized deposits that precisely decorate the laser-drawn areas and remain embedded in the silicone layer without touching the glass substrate underneath.

Easy-Pull Silicone/Glass Interface

Figure 13:
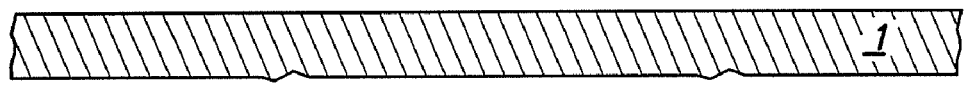
FIG. 13 depicts a cross-sectional view of a substrate.
Figure 14:
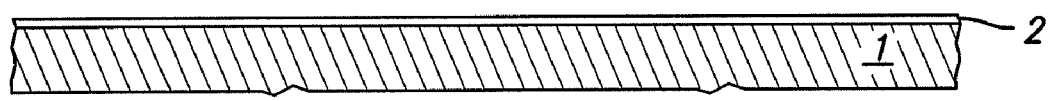
FIG. 14 depicts a cross-sectional view of a substrate and a layer of a non adhering agent.
Figure 15:
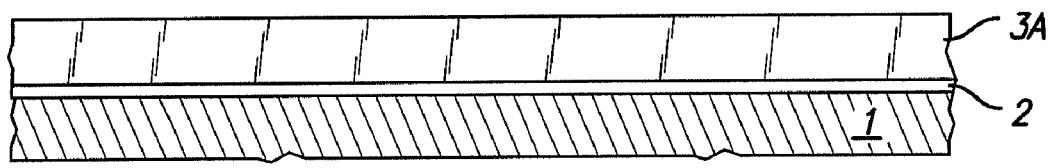
FIG. 15 depicts a cross-sectional view of a substrate and a layer of a non adhering agent and a first polymer layer after curing.
Figure 16:
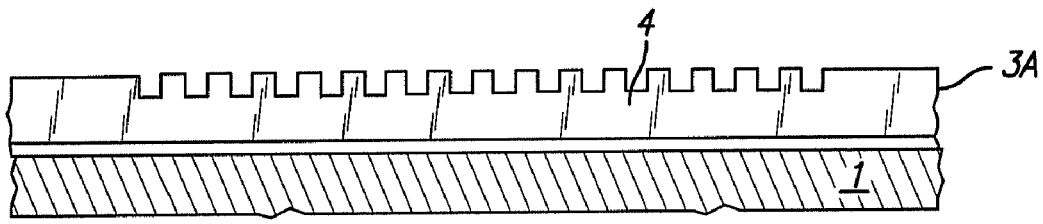
FIG. 16 depicts a cross-sectional view of a substrate and a layer of a non adhering agent and a first polymer layer after laser treatment.
Figure 17:
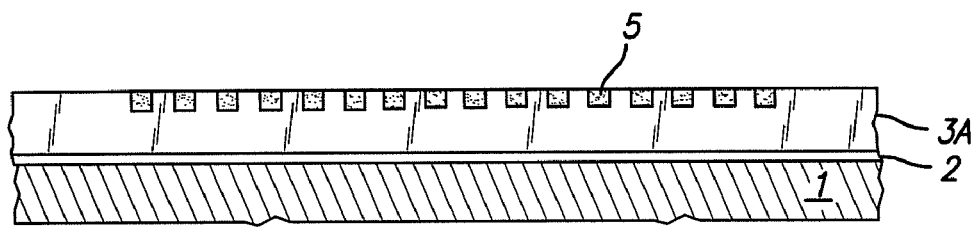
FIG. 17 depicts a cross-sectional view of a substrate and a layer of a non adhering agent and a first polymer layer after metallization whereby metal traces were obtained.
Figure 18:
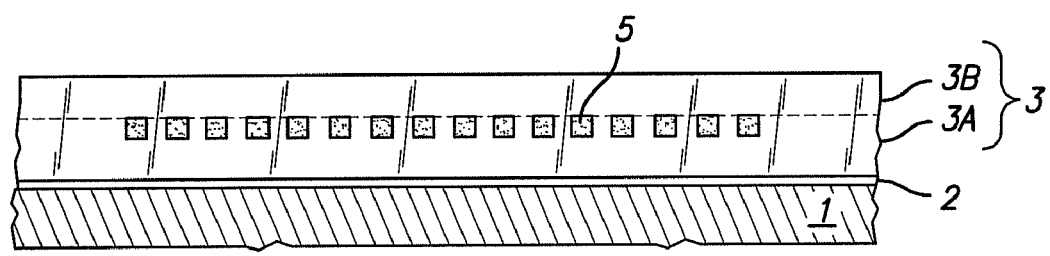
FIG. 18 depicts a cross-sectional view of a substrate and a layer of a non adhering agent and a first polymer layer after disposing a second polymer layer on top of the first polymer layer and the metal traces.

A glass plate is coated on one of its faces with a anti adherent layer (2) like $CaF_2$ or $MgF_2$ film as shown in FIGS. 13 and 14. A silicone layer is then spun on the coated face of the glass plate and form a 10 μm-30 μm thick layer. That layer is cured in oven before being further scanned with a focused 248 nm excimer laser beam. The laser beam induces partial decomposition of the silicone material and engraves it to 10 μm-15 μm depth. Immersion in a Pt autocatalytic bath induces deposition of Pt on these engraved traces as in Example 1 above. Because of the poor adhesion of silicone on the $MgF_2$ film, the metallized silicone layer is further pulled from the $MgF_2$ coated glass plate and made free as shown in FIGS. 13-20.

Silicone Cover for Encapsulating Metallized Silicone

Figure 19:
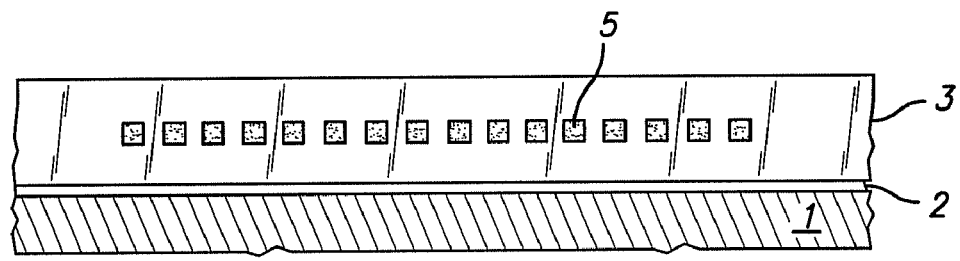
FIG. 19 depicts a cross-sectional view of a substrate and a layer of a non adhering agent and a first polymer layer and metal traces after curing the second polymer layer.
Figure 20:
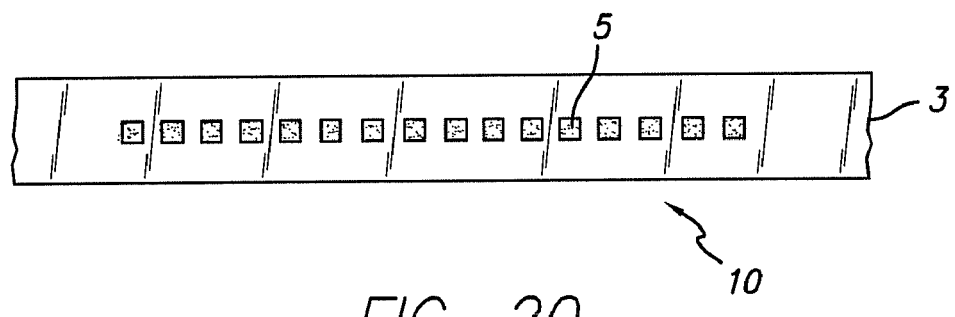
FIG. 20 depicts a cross-sectional view of a polymer layer with one embedded series of metal traces after removing from the rigid substrate.

After preparing the metallized silicone layer (2) on $MgF_2$ coated glass substrate (1), a second 10 μm-30 μm thick polymer (3A) like silicone layer is spun on the once metallized first silicone layer and cured in oven as shown in FIG. 19. An optimum silicone to silicone adhesion of the latter is thus achieved that provides a fully protected cover to the metallized silicone layer. The set of two silicone layers is then pulled from the glass substrate and materializes the full silicone-encapsulation of the once produced Pt traces as shown in FIGS. 16-19.

Multi-Layering Metallized Silicone

Before pulling the set of two polymer layers, like silicone layers, the second and last layer is laser irradiated and metallized as previously. The new metallized traces in that second layer remain within the engraved part of that layer down to approx. 5 μm-15 μm, i.e. still separated from the underlying metallized traces in the first layer by some 5 μm-15 μm and, thus, avoiding eventual and undesired interconnects in between the two sets of metallized traces. The 2-layer silicone structure is then covered with a final, cured virgin silicone layer. The resulting 3-layer structure is further pulled from the $MgF_2$ coated glass substrate, materializing a silicone-encapsulated 3-D structure that contains two sets of independent metallized Pt-traces as shown in FIGS. 24-27.

Interconnection in Multi-Layered Silicone 3-D Structure

A first silicone layer is spun on a $MgF_2$ covered glass substrate. The outer surface of that first layer is further excimer laser processed and Pt-metallized. A second silicone layer is spun on the metallized silicone surface to form a cover to the first layer. In order to get access to the underlying Pt-traces, irradiation with the same excimer laser source working at 248 nm is performed onto the cover at an area that overlaps a section of an underlying Pt-trace. Decomposition of silicone is performed at the site and maintained upon repeated pulsed-irradiation. The procedure drives silicone out of that area and bores the layer until reaching the underlying Pt-trace.

Having opened that window to the embedded Pt-circuit, the silicone structure on its glass substrate is immersed in a Pt-autocatalytic bath that drives the metallization into the window, down to the underlying trace and ultimately fills the window space with Pt. A new laser-irradiation of that second silicone layer that is now equipped with the metallized window is performed along a path that crosses the metallized window. A further immersion in the autocatalytic bath results in the metallization of the path while bringing additional metal to the window. In that way, a direct interconnect is obtained between the upper lying trace in the second silicone layer and the lower lying trace in the first one.

Actual Laser Wavelength for Boring Windows in Silicone

Similar to Example 5 but the excimer laser source is here operated at 193 nm, 6.2 eV photon energy, when opening the windows to the second silicone layer. In that case, full decomposition of silicone is achieved in contrast with the partial decomposition resulting from the 248 nm irradiation. At that 193 nm wavelength, decomposition and emission of matter is i) far more efficient (i.e. rapid) than at 248 nm and ii) leaves a clean and smooth opening down to the underlying trace.

Overlapping Silicones with Different Formulations

In all previous examples, silicones have a formulation that contains generally a variable amount of silica foam additive that serves to strengthen the polymeric structure in various ways. It also favors the electroless-metallization process and improves substantially the mechanical behavior of metallized silicone. However, the final silicone cover remains un-metallized and serve solely the purpose of protecting from ambient the underlying metallized layers. That silicone cover may be formed with a silicone that is different from the one silicone that has been used for the other underlying layers. In particular, it may not contain silica at all and may then be more readily spun, even to very small layer thickness Therefore, following from Examples 3 and 4 above, a silicone cover of 20 μm is formed on the last metallized silicone layer. That silicone cover is formed with a silica-free silicone that is spun onto the multi-layered metallized silicone before curing as above.

Spinning Silicone on a Spherical, $MgF_2$-Coated Glass Surface

A plano-convex lens is coated on its convex surface with a $MgF_2$ film. Then, the lens is positioned and fixed solidly on a turntable having i) its planar, uncoated surface directly in contact with the turntable surface and ii) its axis precisely along the turntable rotation axis. A given amount of silicone is then positioned about the center of the convex surface of the lens and the turntable let to rotate.

This brings silicone to spread by spinning over the entire convex surface. After a period of time, of the order of 1 min, rotation is interrupted and a silicone layer is formed all over the convex surface and the silicone-covered lens is passed into an oven for silicone-curing. As in the previous examples, scanning the cured silicone surface with an excimer laser beam is then performed, followed by a subsequent platinum-metallization of the resulting laser-produced trace. A second silicone layer is further spun on this metallized silicone surface and cured in an oven. The final silicone bi-layered structure is pealed off its convex $MgF_2$-coated glass substrate. That pealed-off silicone structure is not planar but curved, having duplicated the spherical geometry of the lens substrate on which it has been formed.

Metallizing a Spherical, Silicone Molded Substrate

Silicone rubber is injected in an hemispherical mold. After un-molding the resulting silicone piece and like in all preceding examples, a laser beam is scanned on its molded hemispherical surface and the resulting laser-processed traces brought to further Pt-metallize. Similarly to Example 8, a silicone layer is further spun on the hemispherical metallized silicone surface.

Metallizing an Expanded Silicone Layer for Enhanced Metal Imbedding

Silicone is spun on a planar, $MgF_2$-coated glass substrate, oven-cured and pealed off its substrate. The pealed-off layer is then mounted to adhere gently but uniformly onto the surface of a $MgF_2$-coated glass cylinder, in such a way that the actual cylinder diameter does allow the silicone layer to run all around the cylinder without overlapping on itself. The silicone-covered cylinder is then mounted on a motorized rotation axel and that motorized axel positioned on an x-y table that may move the motorized axel in a plan parallel to the axel axis. Laser processing the silicone layer is further performed with the laser axis being perpendicular to the cylinder axis while displacing it along with the x-y table. After inscribing the laser-processed traces on the convex, expanded silicone surface, the silicone layer on its glass cylinder is brought in an electroless Pt bath for metallization of the traces. This being done, the metallized silicone layer is detached from the glass cylinder and recovers its original planar geometry. In so doing, the once-expanded Pt-traces (at time of their production) contract, enclosing the metal parts into silicone and providing an enhanced integration of these traces into the silicone layer.

Accelerating Pt-Metallization of Silicone

The electroless Pt-metallization proceeds via forming a thin so-called black Pt film and then goes on a second step of Pt-deposit that thickens the metal layer. That second step is extremely slow being impaired in particular with the formation of H-bubbles on a quite uneven metallizing surface, bubbles that tend to obliterate the surface and limit its direct contacting to the electroless bath. Accelerating this second metallization step is performed as follows.

After having initiated that second step, the silicone layer on its substrate is pulled out of the bath and its surface is blown for a few seconds with a hot air jet as produced by a standard air-gun. The jet cleans up the surface and heats up the metal deposit. The layer is then returned to the bath for a period of 5 to 10 minutes before being pulled again from the bath, re-blown as before and re-immersed in the bath. The process is repeated regularly (and automated eventually) at 5-10 minutes intervals until the necessary metal thickness has been attained. With this transient heat procedure, time reduction in the process of Pt-metallizing is substantial (from 2-3 hours to 30 minutes) and the metal deposit may attain a large thickness that may not be accessible without it.

Independently from all the above advantages of the present invention and which will be obvious from the following examples, the list of added species to the polymeric base which are necessary for the metallization of a composite is not limitative. It may be accrued without changing the process.

Figure 21:
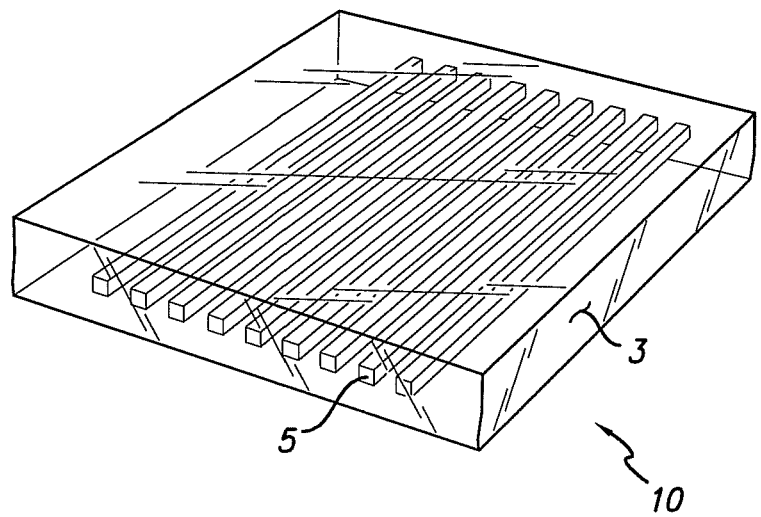
FIG. 21 depicts a perspective view of a polymer layer with one embedded series of metal traces as shown in FIG. 8.
Figure 22:
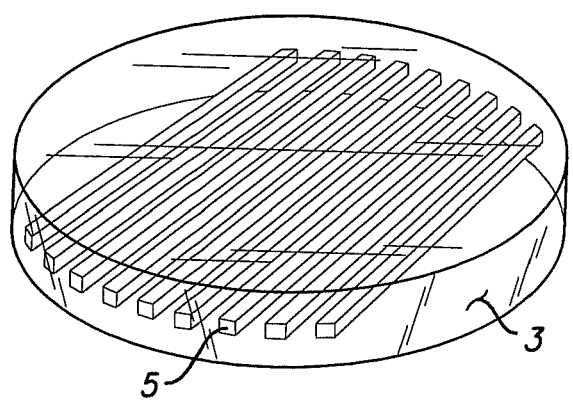
FIG. 22 depicts a perspective view of a polymer layer with one embedded series of metal traces as shown in FIG. 8 after a cut out of the polymer.
Figure 23:
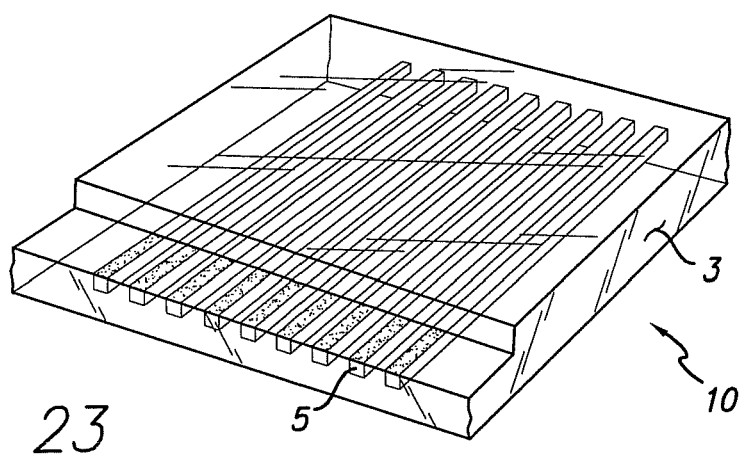
FIG. 23 depicts a cross-sectional view of a polymer layer with one embedded series of metal traces after opening the traces.
Figure 24:
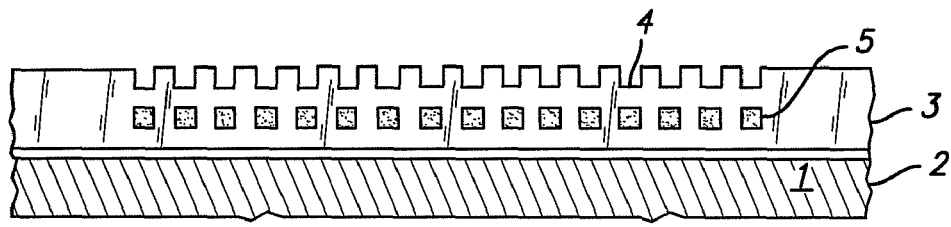
FIG. 24 depicts a cross-sectional view of the polymer layer after laser treatment of the second polymer layer.
Figure 25:
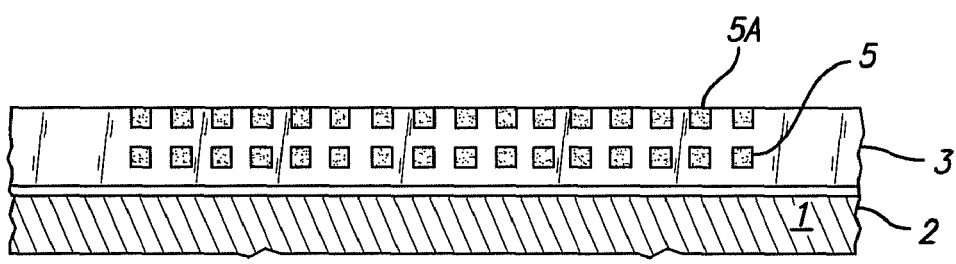
FIG. 25 depicts a cross-sectional view of the polymer layer after metallization of the second polymer layer.
Figure 26:
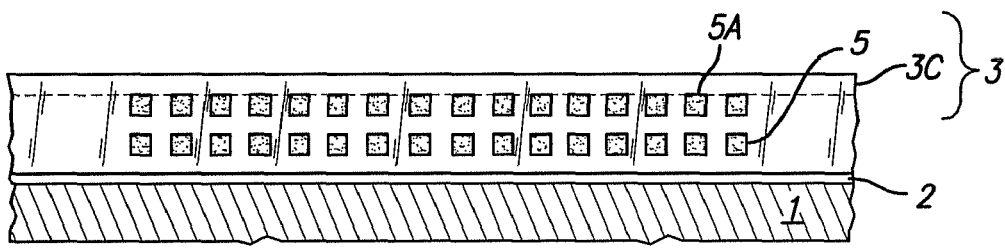
FIG. 26 depicts a cross-sectional view of the polymer layer after applying a third polymer layer and after curing.
Figure 27:
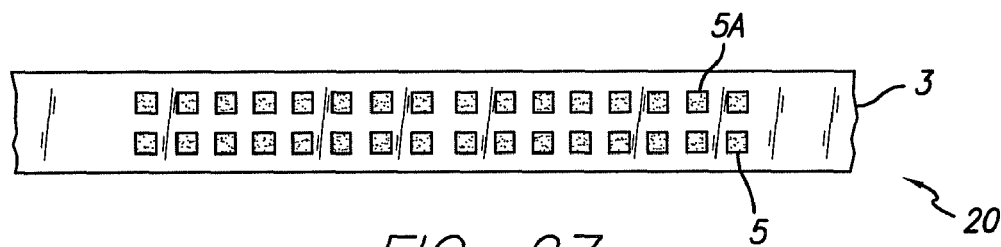
FIG. 27 depicts a cross-sectional view of a polymer layer with two embedded overlapping crossing series of metal traces after removing the layer from the rigid substrate.

FIGS. 21 to 23 show a polymer layer preferably silicone layer (3) containing metal traces (5), preferably platinum which are embedded in the polymer (3). FIG. 21 shows the polymer layer (3) after being removed from the substrate (1). FIG. 22 shows the polymer layer (3) shaped as a circle. FIG. 23 shows the polymer layer (3) after applying openings to the metal traces (5).

Figure 28:
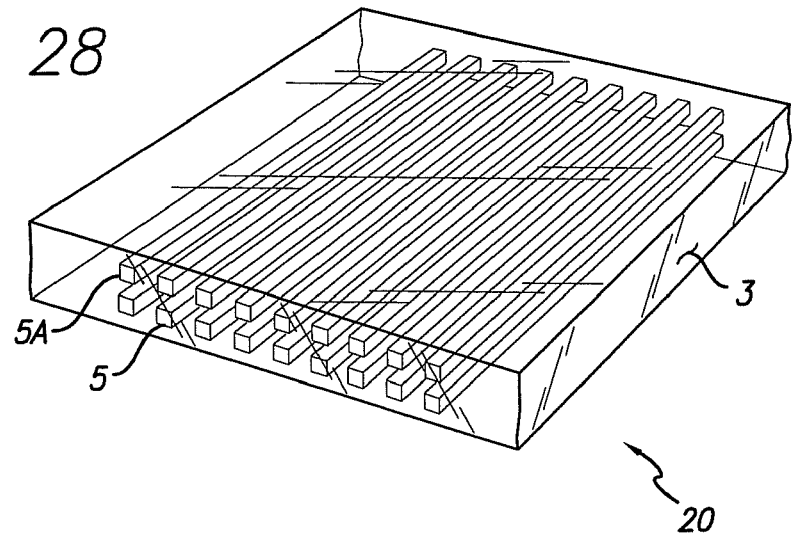
FIG. 28 depicts a perspective view of a polymer layer with two embedded overlapping series of metal traces as shown in FIG. 27.
Figure 29:
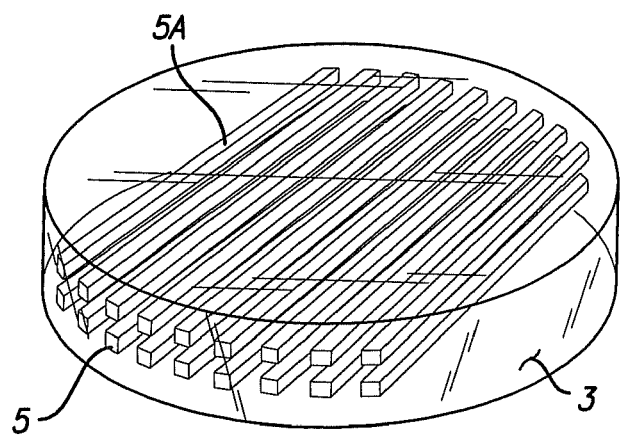
FIG. 29 depicts a perspective view of a polymer layer with one embedded series of metal traces as shown in FIG. 28 after a cut out of the polymer.
Figure 30:
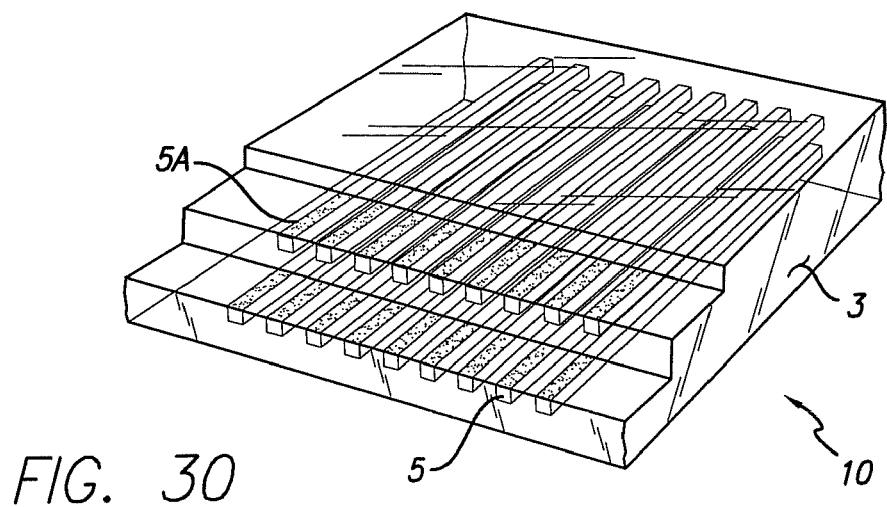
FIG. 30 depicts a cross-sectional view of a polymer layer with two embedded series of metal traces as shown in FIG. 28 after opening the traces.
Figure 31:
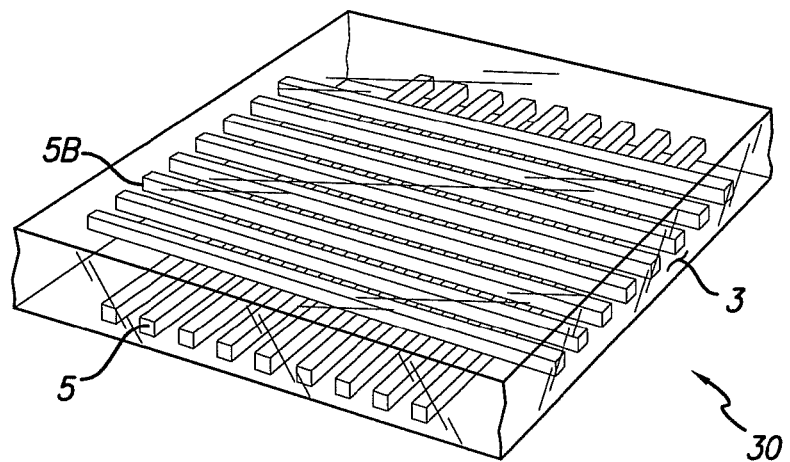
FIG. 31 depicts a perspective view of a polymer layer with two embedded overlapping crossing series of metal traces.
Figure 32:
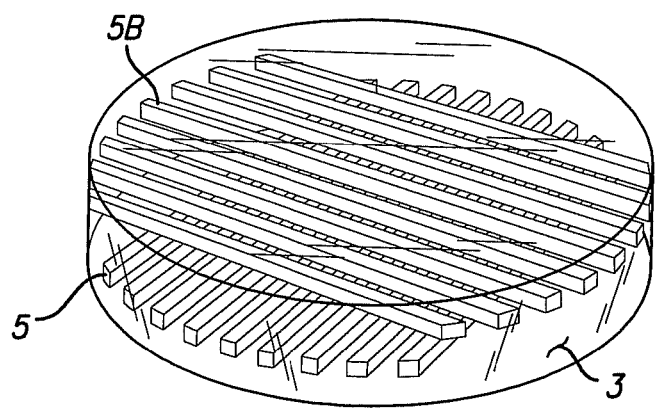
FIG. 32 depicts a perspective view of a polymer layer with two embedded series of metal traces as shown in FIG. 31 after a cut out of the polymer.
Figure 33:
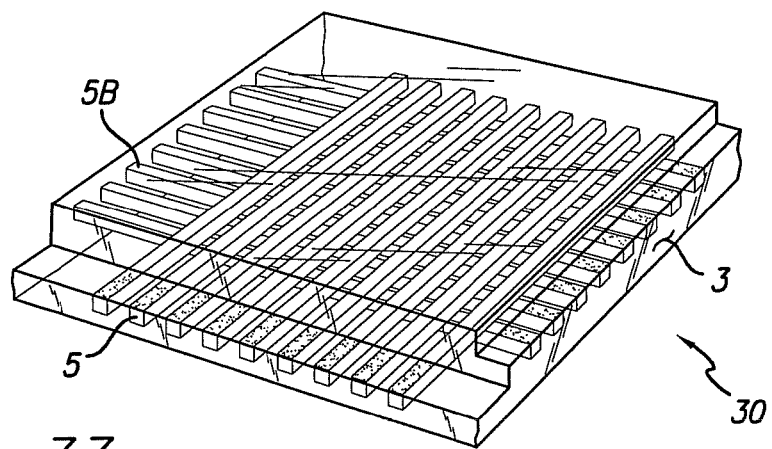
FIG. 33 depicts a cross-sectional view of a polymer layer with two embedded series of metal traces as shown in FIG. 31 after opening the traces.

FIGS. 28 to 30 and FIGS. 31 to 33 show [similar to FIGS. 21 to 23] a polymer layer lift off a substrate (FIGS. 28 and 31), shaped as a circle (FIGS. 29 and 32) and after applying openings to the traces (FIGS. 30 and 33). FIGS. 28 to 30 show two layers of metal traces (5) and (5A) stacked in a parallel arrangement in the polymer layer (3). FIGS. 31 to 33 show metal traces (5) and (5B) stacked in a perpendicular arrangement in the polymer layer (3).

FIGS. 34A to 34G show the sequence for producing an interconnection between traces crossing each other like traces of platinum (5) and (5B).

Figure 34A:
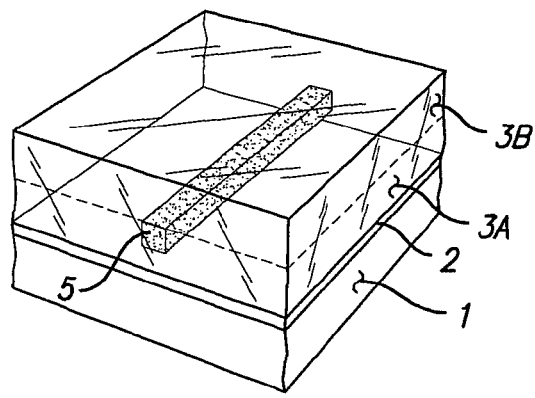
FIG. 34A depicts a perspective view of a first polymer layer with one embedded metal trace.

FIG. 34A depicts a perspective view of a polymer layer (3A) and (3B) layer with one embedded metal trace (5) in (3A).

Figure 34B:
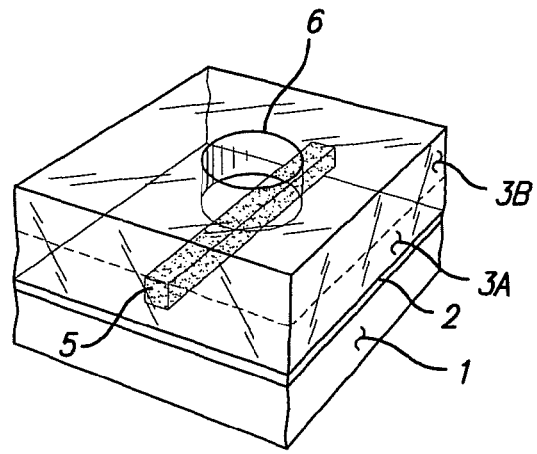
FIG. 34B depicts a perspective view of a first polymer layer after laser drilling through the upper front of the layer to form an opening down to the metal trace.

FIG. 34B depicts a perspective view of a polymer layer (3A and 3B) after laser drilling through the upper font (3B) of the layer to form an opening (6) down to the metal tract (5).

Figure 34C:
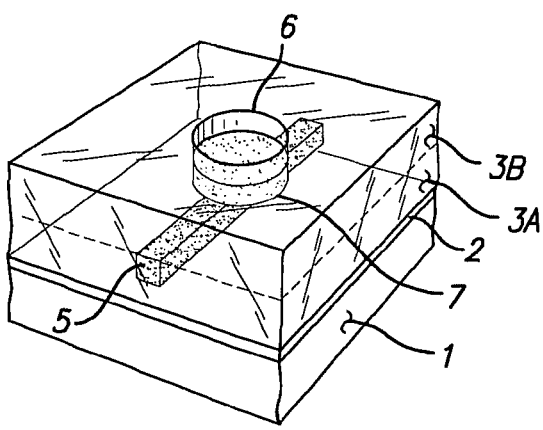
FIG. 34C depicts a perspective view of a first polymer layer after partial metal plating of the laser cut opening.

FIG. 34C depicts a perspective view of a polymer layer (3A) and (3B) after partial metal plating (7) of the laser cut opening (6).

Figure 34D:
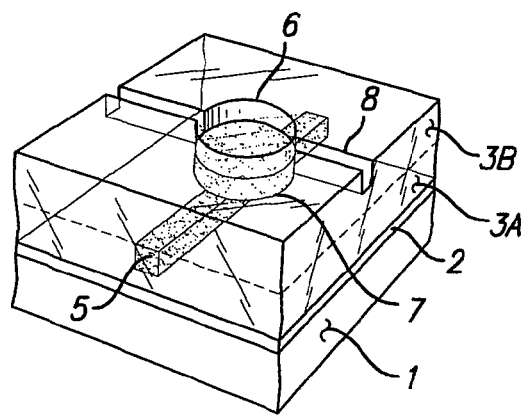
FIG. 34D depicts a perspective view of a first polymer layer after laser processing the traces to overlap the opening.

FIG. 34D depicts a perspective view of a polymer layer after laser processing traces (8) into the upper layer (3B) to overlap the opening (6).

Figure 34E:
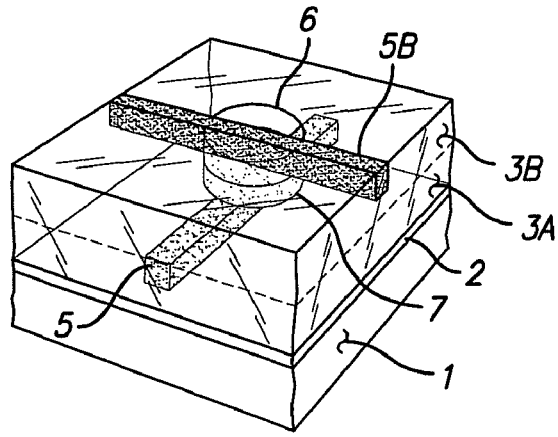
FIG. 34E depicts a perspective view of a first polymer layer after metallizing of the trace and further metallizing the opening.

FIG. 34E depicts a perspective view of a polymer layer after metallizing (5B) of the tract (8) and further metallizing (7) the opening (6).

Figure 34F:
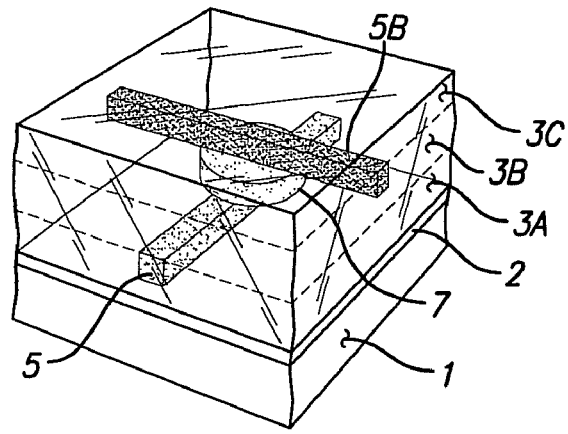
FIG. 34F depicts a perspective view of a first polymer layer after disposing a second polymer layer on top of it and form a bi-layer.

FIG. 34F depicts a perspective view of a polymer layer after disposing a second polymer (3C) layer on top of it and form a bi-layer.

Figure 34G:
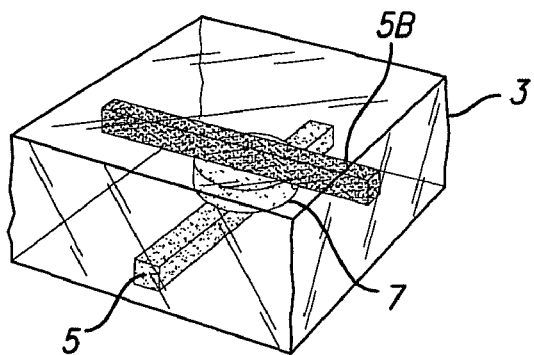
FIG. 34G depicts a perspective view of a polymer layer after removing the layer from the rigid substrate.

FIG. 34G depicts a perspective view of a polymer layer (3A-3C) after removing the layer from the rigid substrate (1).

The platinum metallization of silicone is a process of several steps which are explained below in Example 1 and Example 2.

Example 1

1. Protective Coating with PMMA

A silicone sheet (NuSil MED 4950 from NUSIL TECHNOLOGY LLC, Carpinteria, Calif.) having a thickness of 80 µm was spray-coated with a 2 µm thick PMMA layer. The silicone sheet was immersed for five minutes in an ultrasonic bath at 40° C., containing a low acidity 1.5% HCl solution. The silicone sheet was than two times rinsed with distilled water.

2. First Metallization

The silicone sheet was Pt-metallized for 6 hours in two successive platinization baths.

The silicone sheet was immersed in 100 ml plating solution containing 0.6 g of potassium (II) tetra-nitro-platinate, 20 ml of ammonium hydroxide 28%, and 0.2 g of complexing agent. The silicone sheet was then rinsed with distilled water.

3. Removal of PMMA Protective Coating:

The silicone sheet was immersed in two successive and fresh ultrasonic baths for five minutes each containing $CHCl_3$ that dissolved the PMMA protection layer. The silicone sheet was two times rinsed for 5 minutes to 10 minutes in ultrasonic distilled water bath and dried.

4. Final Metallization

Silicone sheet was mounted on a glass cylinder. The glass with the silicone sheet was immersed in the same metallizing solution being in a thermo stated vessel for 3 hours to 5 hours. From time to time (e.g. every 10 minutes), $H_2$ bubbles are eliminated from sheeting by vibrating the cylinder or by heat flashing the silicone sheet. The silicone sheet was rinsed in distilled water at the end of the procedure.

PMMA coating allowed removal of irradiation residues that were generated during irradiation and could sediment laterally to the irradiated areas. It should be operated at constant pressure of the PMMA suspension, scanning the sheeting at fixed distance and constant speed, and in a clean environment (either grey room or glove box under Argon atmosphere).

Step-two glass cylinder and thermo stated vessel both were specifically designed for this purpose. The present invention provides the metallizing of an expanded silicone layer for enhanced metal imbedding. A silicone is applied on a glass cylinder. After inscribing the laser-processed traces on the convex, expanded silicone surface, the silicone layer on the glass cylinder is brought in an electroless Pt bath for metallization of the traces. The metallized silicone layer is detached from the glass cylinder and recovers its original planar geometry. The expanded Pt-traces contract enclosing the metal parts into silicone and providing an enhanced integration of these traces into the silicone layer. The once-expanded Pt-traces at time of their production contract and enclose the metal parts in the silicone providing an enhanced integration of these traces into the silicone layer.

Example 2

1. Protective Coating with PMMA

A silicone sheet (NuSil MED 4950 from NUSIL TECHNOLOGY LLC, Carpinteria, Calif.) having a thickness of 80 µm was spray-coated with a 2 µm thick PMMA layer. The silicone sheet was immersed for five minutes in an ultrasonic bath at 40° C., containing a low acidity 1.5% HCl solution. The silicone sheet was than two times rinsed with distilled water.

2. First Metallization

The silicone sheet was Pt-metallized for 6 hours in two successive platinization baths.

The silicone sheet was immersed in 100 ml plating solution containing 0.6 g of potassium (II) tetra-nitro-platinate, 20 ml of ammonium hydroxide 28%, and 0.2 g of complexing agent. The silicone sheet was then rinsed with distilled water.

3. Removal of PMMA Protective Coating:

The silicone sheet was immersed in two successive and fresh ultrasonic baths for five minutes each containing $CHCl_3$ that dissolved the PMMA protection layer. The silicone sheet was two times rinsed for 5 minutes to 10 minutes in ultrasonic distilled water bath and dried.

4. Final Metallization

Silicone sheet was mounted on a glass cylinder. The glass with the silicone sheet was immersed in the same metallizing solution being in a thermo stated vessel for 3 hours to 5 hours. From time to time (e.g. every 10 minutes), $H_2$ bubbles are eliminated from sheeting by vibrating the cylinder or by heat flashing the silicone sheet. The silicone sheet was rinsed in distilled water at the end of the procedure.

PMMA coating allowed removal of irradiation residues that were generated during irradiation and could sediment laterally to the irradiated areas. It should be operated at constant pressure of the PMMA suspension, scanning the sheeting at fixed distance and constant speed, and in a clean environment (either grey room or glove box under Argon atmosphere).

Step-two glass cylinder and thermo stated vessel both were specifically designed for this purpose. The present invention provides the metallizing of an expanded silicone layer for enhanced metal imbedding. A silicone is applied on a glass cylinder. After inscribing the laser-processed traces on the convex, expanded silicone surface, the silicone layer on the glass cylinder is brought in an electroless Pt bath for metallization of the traces. The metallized silicone layer is detached from the glass cylinder and recovers its original planar geometry. The expanded Pt-traces contract enclosing the metal parts into silicone and providing an enhanced integration of these traces into the silicone layer. The once-expanded Pt-traces at time of their production contract and enclose the metal parts in the silicone providing an enhanced integration of these traces into the silicone layer.

While the invention has been described by means of specific embodiments and applications thereof, it is understood that numerous modifications and variations could be made thereto by those skilled in the art without departing from the spirit and scope of the invention. It is therefore to be understood that within the scope of the claims, the invention may be practiced otherwise than as specifically described herein.

What we claim is:

1. A polymer comprising silicone containing oxide particles of $SiO_2$, $TiO_2$, $Sb_2O_3$, $SnO_2$, $Al_2O_3$, $ZnO$, $Fe_2O_3$, $Fe_3O_4$, talc, hydroxyapatite or mixtures thereof and at least one metal trace embedded in said polymer, wherein the at least one metal trace is bonded to the polymer by a covalent silicon metal bond.

2. The polymer of claim 1 wherein said polymer comprising a silicone is an elastomer formulation, silicone copolymer, silicone-silicone copolymer, silicone-hydrocarbon copolymer, silicone block polymer, silicone block copolymer, silicone rubbers or mixtures thereof.

3. The polymer of claim 1 wherein said oxide particles are silica structures, silica foam, fumed silica, polycrystalline, fibers, fiber pieces or mixtures thereof.

4. The polymer as claimed in claim 1 wherein the particle size of said oxide particles are between 0.5 µm and 100 µm.

5. The polymer as claimed in claim 1 wherein the proportion of said oxide particles contained in said polymer is between 1 and 50 Vol.-%.

6. The polymer as claimed in claim 1 obtained by coating a first polymer layer containing said oxide particles and coating a second polymer layer on the first polymer layer having a lower Vol.-% to about 0 Vol.-% of said oxide particles.

7. The polymer of claim 1 comprising metal traces of one or more of the following metals titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, or gold, or an alloy of two or more metals, or a combination of two or more alloys or metal layers thereof.

8. The polymer of claim 1 comprising one or more of the following metals titanium, tantalum, chromium, iridium, palladium, platinum, silver, or gold, or an alloy of two or more metals, or a combination of two or more alloys or metal layers thereof.

* * * * *